(12) United States Patent
Yializis (10) Patent No.: US 9,968,963 B2
(45) Date of Patent: May 15, 2018

(54) FUNCTIONAL COATING

(71) Applicant: SIGMA LABORATORIES OF ARIZONA, LLC, Tucson, AZ (US)

(72) Inventor: Angelo Yializis, Tucson, AZ (US)

(73) Assignee: SIGMA LABORATORIES OF ARIZONA, LLC, Tucson, AZ (US)

( * ) Notice: Subject to any disclaimer, the term of this patent is extended or adjusted under 35 U.S.C. 154(b) by 0 days. days.

(21) Appl. No.: 14/841,255

(22) Filed: Aug. 31, 2015

(65) Prior Publication Data

US 2017/0056920 A1    Mar. 2, 2017

(51) Int. Cl.
| | |
|---|---|
| *B05D 5/12* | (2006.01) |
| *B05D 3/04* | (2006.01) |
| *B05D 7/04* | (2006.01) |
| *B05D 3/14* | (2006.01) |
| *B05D 5/08* | (2006.01) |
| *H05K 3/28* | (2006.01) |
| *C08J 7/12* | (2006.01) |
| *C08J 7/16* | (2006.01) |
| *D06M 14/18* | (2006.01) |

(52) U.S. Cl.
CPC .......... *B05D 3/0493* (2013.01); *B05D 3/142* (2013.01); *B05D 3/144* (2013.01); *B05D 5/083* (2013.01); *B05D 7/04* (2013.01); *C08J 7/123* (2013.01); *C08J 7/16* (2013.01); *D06M 14/18* (2013.01); *H05K 3/28* (2013.01); *C08J 2333/16* (2013.01)

(58) Field of Classification Search
USPC ................................................. 427/534–540
See application file for complete search history.

(56) References Cited

U.S. PATENT DOCUMENTS

| | | | | |
|---|---|---|---|---|
| 3,547,683 | A * | 12/1970 | Hayes ...................... | B05D 1/60 427/255.5 |
| 6,083,628 | A * | 7/2000 | Yializis ..................... | B05D 1/60 428/461 |
| 6,214,422 | B1 * | 4/2001 | Yializis ..................... | B05D 1/60 427/255.6 |
| 6,444,274 | B2 | 9/2002 | Gorbig | |

(Continued)

FOREIGN PATENT DOCUMENTS

| | | |
|---|---|---|
| WO | 98/18852 A1 | 5/1998 |
| WO | 97/37844 A1 | 10/1998 |

OTHER PUBLICATIONS

International Search Report and Written Opinion in related International Application No. PCT/US 2016/049525, dated Dec. 8, 2016 (14 pages).

*Primary Examiner* — Brian K Talbot
(74) *Attorney, Agent, or Firm* — Yakov S. Sidorin; Quarles & Brady LLP (57) ABSTRACT

A method for creating a functional coating on a substrate in vacuum from a deposited monomer material in absence of oxygen and/or radiation from a radiation source. The substrate may be preliminarily activated with inert gas to form an activated layer thereon. The method may include depositing a fluorine containing monomer having a first $CF_3:CF_2$ ratio, and forming, on the substrate, the self-assembled polymer coating that has a second $CF_3:CF_2$ ratio, where the first and second $CF_3:CF_2$ ratios are equal.

8 Claims, 3 Drawing Sheets

(56) References Cited

U.S. PATENT DOCUMENTS

| | | | |
|---|---|---|---|
| 7,157,117 B2 * | 1/2007 | Mikhael | B01D 39/1623 427/255.6 |
| 8,840,970 B2 | 9/2014 | Yializis et al. | |
| 2010/0098876 A1 * | 4/2010 | Hanson | B05D 1/185 427/535 |
| 2012/0164901 A1 * | 6/2012 | Yahiaoui | D06M 15/263 442/59 |
| 2012/0184165 A1 * | 7/2012 | Yializis | D04H 1/559 442/71 |
| 2012/0296032 A1 | 11/2012 | Legein et al. | |

* cited by examiner

FUNCTIONAL COATING

TECHNICAL FIELD

The present invention relates to methods for functionalizing a material surface and, more particularly, to a method for self-assembly of a nanothick polymer layer achieved during the process that is devoid of the use a source of radiation and/or plasma and/or heat.

BACKGROUND

The term "functionalization" and related terminology are used in the art to refer to the process of treating a material to alter its surface properties to meet specific requirements for a particular application. For example, a surface of a material may be treated to render this surface particularly i) hydrophobic and/or ii) oleophobic and hydrophilic and/or iii) oleophilic as may be desirable for a given use. Thus, surface functionalization has become common practice in the manufacture of many materials because it adds value to the end product. In order to achieve diverse results, the surface functionalization may be carried out in a variety of ways ranging from gaseous and wet chemistry to vacuum and atmospheric plasma, as well as various vacuum chemical vapor and evaporation and sputtering deposition methods.

The processes of functionalization of porous materials or media have been accompanied with practical shortcomings caused by the processes themselves. Specifically, the degree of porosity of the materials of interest is typically reduced as a result of functionalization of the surface of the material. Non-limiting examples of porous materials include textiles, non-woven products and paper (all of which have inherent properties derived from the nature of the constituent fibers); In forming such materials, various synthetic and natural fibers (for example, polypropylene, nylon, polyethylene, polyester, cellulosic fibers, wool, silk, and other polymers and blends, to name just a few) can be shaped into different products with a great range of mechanical and physical properties, and used to create protective uniforms, biomedical fabrics and membranes, housing products, and filter media for gas and liquid filtration. The porosity of these materials usually serves a necessary function, such as, for example, the ability to be permeated with a fluid (such as gas and/or liquid), filtration of particulates, or absorption of liquids Any treatment of a surface of a porous material carried out with the purpose of further modifying the chemical properties of the constituent fibers by appropriately functionalizing them is preferably carried out, to the extent possible, without affecting the porosity of the material. The terms nonwoven, fabric, textile, porous, and media are used interchangeably to describe a material that has a porous character.

For example, various wet-coating chemical processes have been used traditionally to treat with polymers and functionalize a fibrous material (interchangeably referred to herein as a porous substrate) that is otherwise inert or have limited surface functionality. These wet chemical processes may involve the immersion of the fibrous material in liquids or fluid foams to coat individual fibers and impart specific functionalities onto surface(s) of the fibrous material while retaining the material's porosity and its property of being permeable to fluids. Practice proves that, in spite of many claims to the contrary, such wet-chemistry processes at best materially reduce the porosity of the fibrous material at hand and, in the worst cases, essentially cause plugging of the interstices between individual constituent fibers. While the functionalization of a porous substrate by wet-chemistry may produce the desired results in terms of achieving the desired functionality of the treated surface(s), it also can cause deterioration of the mechanical characteristics of such substrate (either due to reaction with solvents used or exposure to the high temperature required to effectuate a reaction between the functional groups and the substrate, for example). Furthermore, the use of water-based chemical solutions requires the use of an energy-consuming drying oven and the use of organic-solvent-based solutions requires the use of a solvent recovery system. In all cases, in addition to the use of water, solvents, and/or thermal energy, wet surface treatment (or finishing) processes also create significant quantities of hazardous waste.

Alternative processes, such as vacuum deposition of functional polymers, have been used rather successfully to impart particular functional properties to films, foils and porous substrates without the limitations of wet-coating processes. There is a large body of literature that addresses coatings using atmospheric and vacuum plasma processes (see, for example, U.S. Pat. Nos. 507,539, 6,444,274, 6,242,054, 6,397,458, 6,562,112, 7,244,292, 6,419,871, 675,069, 7,255,291, and 7,300,859). Vacuum plasma polymerization methods have been explored for at least 40 years. Vacuum-plasma based deposition of polymers can be quite effective in coating and functionalization of porous surfaces, but that process has had limited commercial success in applications that require high speed treatment (such as web coating, for example). In a plasma coating process functional molecules in the form of a gas or vapor are introduced into the plasma and are randomly activated by ionization, forming free radicals that lead to formation of a cross-linked coating on a substrate as the activated monomer molecules impinge on it. It is well recognized that the physical and chemical properties of the resulting coating are highly dependent on process parameters such as, for example, pressure, electrode geometry and type of applied voltage (DC, AC, HFAC, Microwave). Additional practical limitation of plasma functionalization of porous substrates stems from, a relatively long exposure of the substrate to the plasma required to assure that a high enough concentration of the functional moiety is deposited on the surface of the substrate. Most methods disclosed in the literature require plasma-exposure times in the range from seconds to minutes. While such long processing times can be commercially acceptable for batch applications, they are not desired for and/or not practically applicable in roll-to-roll applications that require functionalization of webs at speeds of the order of 100 to 1000 feet per minute to create products that are both functionally and economically viable. While one process of high-speed vacuum deposition of a polymer coating that is free of the plasma polymerization limitations and that has been commercially used to functionalize porous webs was addressed by related art, such process has well-defined operational limitations. As disclosed in U.S. Pat. Nos. 7,157,117, 6,468,595, 4,954,371, for example, this process utilizes flash evaporation of a monomer material that is then condensed on a several-meter wide substrate moving at speeds in excess of 1,000 ft/min, followed by radiation curing of the condensed material with the use of electron beam or UV radiation. While a variety of monomers (such as free-radical polymerizable acrylates, cationic polymerizable epoxies and vinyl monomers, for example) can be used in this process to functionalize a surface of the substrate to impart on it a wide range of functionalities (such as, for example, hydrophobicity, oleophobicity, hydrophilicity, oleophilicity, antibacterial, color, anti-stain, metal chelating and antistatic characteristics), all these monomers not only require to be exposed to radiation to be polymerized, but also have to have a high enough molecular weight and be under a high vapor pressure to be condensed on a surface and form a liquid layer that is then converted into a polymer by radiation. Thus, this process cannot utilize monomer materials characterized by such levels molecular weight and/or vapor pressure that causes them to evaporate following a contact with the surface.

In seeking ways to functionalize surfaces with monomers that cannot be effectively condensed and cross linked using a radiation source, U.S. Pat. No. 8,840,970 disclosed another vacuum-based process of functionalization of a surface moving at a high speed that involved modification of the surface with self-assembly of specific functional monomer materials. Depending on the monomer chemistry, this process can be used to create functional surfaces with different chemical properties, including low surface energy used to repel liquids such as water and organics and high surface energy used to enhance wettability of the surface. This process utilizes an oxygen plasma to activate the substrate surface via the formation of free radicals that form covalent bonds with monomers that have acrylate, vinyl, allyl or similar double-bond chemistry. The limitation of this process is that it can be used to form a monomolecular layer on the surface but not a polymer layer.

Accordingly, there remains a need in a process configured to functionalize a surface by the deposition or formation of a thin polymer layer, without the use of wet chemistry, without the presence of a plasma during polymer formation process and without the use of heat or radiation. Solution(s) provided by this invention address the functionalization of web substrates that are processed preferably at high speed in a roll-to-roll process, and although such solutions apply to various types of substrates (including 3D objects), the main focus is made on substrates that have certain level of porosity.

SUMMARY

An embodiment of the present invention provides a method for coating a substrate in a partial vacuum. Such method includes the steps of activating a surface of the substrate in the partial vacuum with the use of ionized gas; depositing a monomer material on the substrate in the absence of oxygen near said surface; maintaining contact between a deposited monomer material and said surface for an amount of time sufficient to form a self-assembled polymer layer on the surface from the deposited monomer material; and evaporating of excess of the monomer material from the surface.

A related embodiment provides a process for rendering an electronic device oleophobic and hydrophobic in a partial vacuum environment. Such process includes a step of forming an activated layer on all surfaces of such device by exposure to an ionized gas in the partial vacuum environment. The method also includes condensing a monomer material on the activated layer in the absence of oxygen near the activated layer and maintaining contact between a condensed monomer material and the surfaces in the device for an amount of time sufficient to form a functional polymer layer on the device surfaces, and evaporating un-polymerized monomer material.

A related implementation provides a method for forming an oleophobic and hydrophobic coating on a substrate in a partial vacuum, which method contains the steps of a) forming an activated layer on a surface of the substrate with the use of an ionized gas; b) condensing a fluorine containing monomer material on the activated layer in the absence of oxygen; and c) maintaining contact between a condensed monomer material and the activated layer for an amount of time sufficient to form a self-assembled polymer layer on the surface of the device surface. Additionally, the method may include evaporating excess of the monomer material from the surface of the device.

Embodiments of the invention also provide a method for forming, on an activated substrate in a partial vacuum with the use of a fluorine-containing monomer characterized by a first $CF_3:CF_2$ ratio, a fluorine-containing polymer coating characterized by a second $CF_3:CF_2$ ratio under processing conditions that enable said first and second ratios to be equal.

BRIEF DESCRIPTION OF THE DRAWINGS

The invention will be more fully understood by referring to the following Detailed Description of Specific Embodiments in conjunction with the not-to scale Drawings, of which.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Implementations of the present invention provide examples of a method for forming, in the absence of radiation (associated with, for example plasma, electron beam, UV light, microwave radiation, RF radiation and heat) a functional coating on a substrate, where the coating includes linear or cross-linked polymer chains that have at least two functional molecules per chain.

The terms "cure, "polymerization", "linear polymerization" and "cross-linking" may be used interchangeably to refer to the process by which at least part of a monomeric material is converted into a polymer.

The term "ionized gas" is understood to refer to a collection of ionized atoms and/or molecules, electrons, radicals and neutrals.

The term "plasma" as used in this invention means ionized gas generated in the immediate vicinity of the substrate, or in contact with the substrate using at least one of DC, AC, continuous RF, and pulsed RF voltages.

The term "remote plasma" means a plasma generated away from the substrate such that the substrate is shielded from and/or not in contact with any species in the plasma except radicals that have longer life and can be carried onto the substrate by neutral gas.

The term "treatment by remote plasma" means treatment by radical gas species generated by a remote plasma.

The terms "treated" and "activated" substrate or substrate surface are used interchangeably to mean a substrate surface that contains radical species generated by exposure of the surface to an ionized gas generated by a plasma or radical species generated by a remote plasma.

The terms "reactive" or "reactivity", when used in reference to a monomer material, describe a monomer material that has a chemical structure with bonds allowing a reaction with an activated surface. Such bonds include, for example, acrylate, methacrylate, vinyl and allyl chemical groups characterized by a double bond that can open to react with the substrate or another monomer molecule, thus causing polymerization.

The term "oxygen gas" as used in this invention means oxygen gas that is either adsorbed on the substrate surface, or is free in the gas volume in the immediate vicinity of and in contact with the substrate.

The terms "radiation" and "radiation source" as it relates to polymerization are used interchangeably and mean heat, UV, electron beam, plasma and various combinations of such energy sources used to polymerize monomeric materials The terms "self assembled" and "self assembly" are used interchangeably to refer to monomer molecules that form a polymer layer without the use of a radiation source and a so-formed polymer layer.

The terms "functional" and "surface functionalization" refer to the addition of functionality to a surface by depositing a coating that has functional properties. Such properties include at least some of oleophobic, hydrophobic, hydrophilic, and antibacterial properties, release-facilitating properties, color, metal chelating, electronic conductivity, and ionic conductivity.

A problem of forming a polymer layer in the vacuum on a substrate surface without the use of radiation from a radiation source is solved by judiciously defining the process conditions to ensure the condensation of a reactive monomer on the activated substrate surface in an environment that precludes contact of radiation with the activated substrate surface and evaporation of excess of monomer from the surface.

Figure 1A:
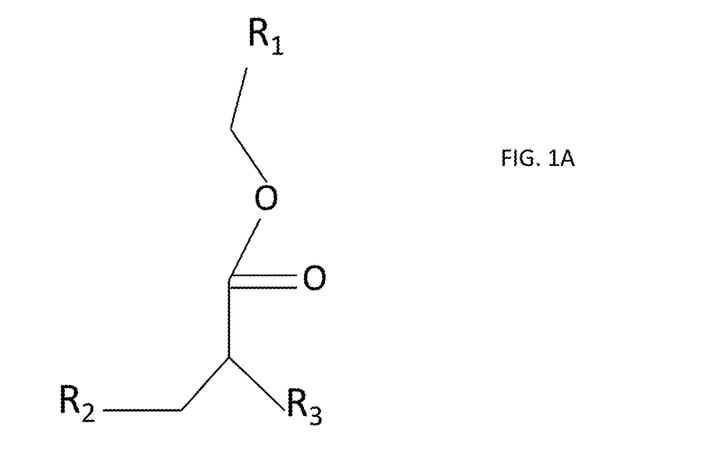
FIG. 1A is an illustration of an attachment of a single molecule to the target surface.
Figure 1B:
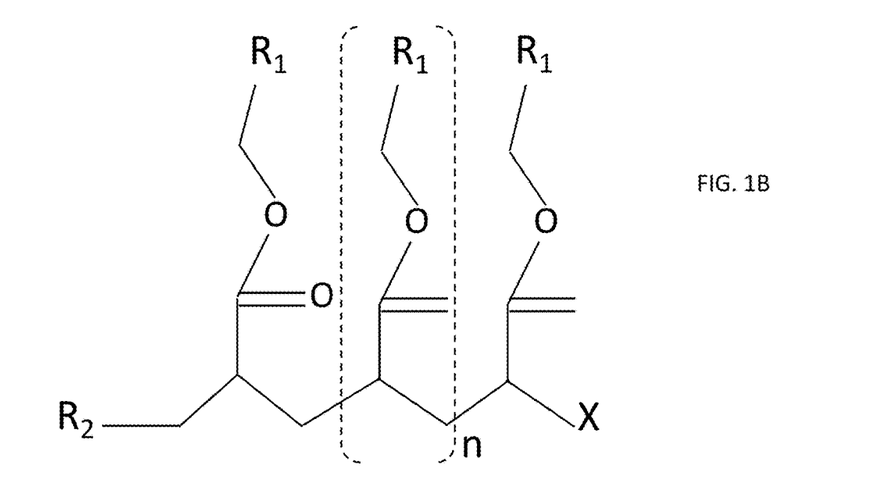
FIG. 1B is an illustration of an attachment followed by linear polymerization, corresponding to an embodiment of the process of the invention.

The disclosed solution to this problem enables a high-speed surface-functionalization process that can be used to functionalize various activated substrates such as films, textiles, membranes, metallized surfaces, and three-dimensional objects (made of, for example, metal, metal oxides, polymer and composite materials) including electronic assemblies such as circuit boards, as well as complete electronic devices such as cellular phones and portable computers. As a practical result of the implementation of the idea of the present invention, the deposition of a functional self-assembled functional polymer layer in the vacuum environment is enabled at high speeds, without using a source of radiation such as plasma, electron beam and UV during the coating-formation process. Notably, such implementation is particularly advantageous under the circumstances known to cause a well-recognized and to-date unaddressed need and, specifically, when a substrate that has to be functionalized includes electronic components that can be adversely affected by the presence of charged particles or radiation used to perform the polymerization process in accord with the currently-employed methods. The proposed solution includes a process of self-assembly of molecules containing reactive functional groups (such as acrylate and vinyl, for example) or other bonds that facilitate reaction with an activated surface. As taught by related art, prior to the deposition of the functional monomer on a surface of the substrate, an activated layer must be formed on the substrate surface with the use of plasma. After the plasma is switched off, a reactive monomer is deposited on the activated surface and is allowed to react with the surface before the excess of the monomer is evaporated to leave behind a functional monomolecular layer of the monomer. The capture cross-section of the reactive molecules is proportional to the reactivity of the activated substrate, the reactivity of the monomer material and the time that a monomer molecule spends in contact with the activated layer. The reactivity of the activated substrate is a function of the type and density of free radical species created by exposure to the plasma. It was empirically discovered that under certain conditions, depending on the plasma gas used to create the reactive layer on the substrate surface, the reactive monomer chemistry and the thickness of the condensed monomer layer deposited on the substrate surface, instead of forming a monomolecular layer, a polymer layer can be formed in the absence of radiation from a radiation source. This process is particularly evident when molecules that have one or more of acrylate, methacrylate, vinyl or other double bonds are used. An example of this mechanism is shown in Figures discussed below. A functional acrylate monomer molecule may be attached on the substrate on its own, as shown in FIG. 1A, where $R_1$ is a functional group and $R_2$ and $R_3$ are activated groups on the substrate. In this manner, a monomolecular layer can be formed on the substrate surface. Alternatively, a side-branch polymerization may occur as shown in FIG. 1B. In this case, the acrylate double bond opens and reacts with a free radical group $R_2$ on the substrate and a linear polymerization is triggered, causing one or more additional acrylate molecules to attach. The process is terminated at X, which denotes a hydrogen atom or another active site on the substrate surface.

The process parameters that allow the polymerization process to take place include monomer chemistry, partial vacuum pressure, substrate temperature, the quantity of monomer deposited on the substrate and the gas chemistry of plasma used to treat the substrate surface. It was empirically discovered that, unlike a single molecule self-assembly process that runs efficiently with an oxygen-based plasma, the linear polymerization process is most effective when the functional groups on the substrate are produced using an ionized gas created with an inert gas plasma (such as argon and/or nitrogen, for example). The related art teaches that an oxygen-based plasma is an effective way of creating, on the target substrate, oxygen-based free radical functional groups such as hydroxyl and carboxyl that initiate the molecular self-assembly process. It was empirically determined that, when treating surfaces and especially surfaces that are porous, the presence of oxygen either in the gas volume in the vacuum chamber or oxygen absorbed or adsorbed on the substrate surface terminates the double bond polymerization reaction. The idea of the present invention is founded on the concept of forming a functional polymer layer using a polymerizable monomer material without an external source of energy (such as a source of electromagnetic radiation, for example). As determined, an implementation of this idea requires activation of a substrate's surface with ionized and/or activated gas and condensation of a reactive monomer on the activated surface in an environment that has no oxygen in the gas volume or near the substrate surface and subsequent evaporation of excess monomer. If an oxygen plasma is used to create the ionized gas, it is possible that some oxygen may be absorbed by the substrate and later be emitted during the monomer condensation process. In addition or alternatively, if the surface activation and monomer condensation steps take place inline in the same chamber, some oxygen will be present in the vacuum environment where the monomer is deposited. The idea of the invention stems from the empirically-supported realization that, that i) when the fabrication process is conducted in a vacuum environment with the residual pressure being as small as 1 mTorr to 1 Torr, the presence of even the residual ambient air (oxygen) molecules is sufficient to inhibit the process of polymerization of the condensed monomer, and that ii) in large commercial roll-to-roll vacuum systems, where the chamber isolation between the ionized gas zone and the monomer condensation zones is not possible, an inert gas such as argon and/or nitrogen can be used both to activate the chamber and to replace the ambient oxygen.

Figure 2A:
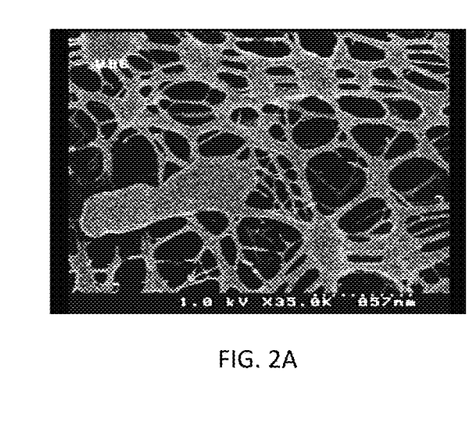
FIGS. 2A, 2B, and 2C, are micrographs of membranes carrying corresponding polymer coatings according to an embodiment of the invention.
Figure 2B:
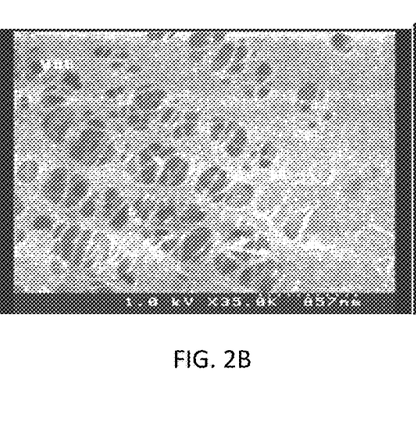
Figure 2C:
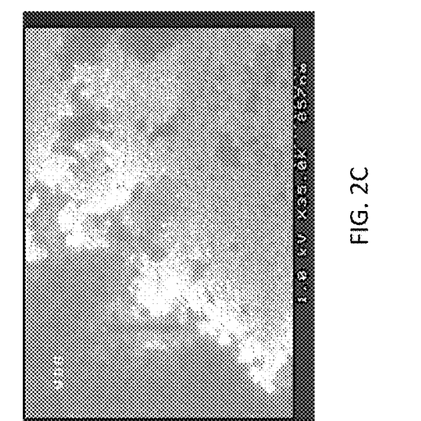

FIG. 2A shows an image of a nano-porous polypropylene (PP) membrane, obtained with a field emission scanning electron microscope (FESEM). When a self-assembled monomolecular layer is formed on the membrane fibers, the appearance of the membrane remains substantially unchanged: a formed monomolecular monomer layer is a layer that is virtually indiscernible by an FESEM. FIG. 2B shows an image of the membrane with a linearly-polymerized coating formed according to an embodiment of the invention, which coating partially covers the surface of the membrane, and FIG. 2C shows a membrane that is fully coated with such a polymer layer. What is unique about the polymer layers shown in FIGS. 2B and 2C is that the polymerization process was conducted in the absence of a radiation source in each of these cases. The membrane is used to demonstrate the polymer-formation process because on a flat film substrate or even on a textile with micron size fibers such thin functional coatings are difficult to image. The usefulness of such process is particularly high when functionalizing a substrate with a coating that imparts hydrophobic and oleophobic properties on the surface. (Such coatings are useful for water-proofing and oleo-proofing membranes, textiles, films, apparel, footwear, etc, as well as electronic devices, such as cellular phones, hearing aids, watches, for example.)

When waterproofing a device such as cellular phone or a computer using a coating formed in a plasma-based process, the device is directly exposed to a plasma containing a functional monomer, for a time period sometimes of the order minutes, which is necessary to form a coating of certain thickness. (For example, U.S. Pat. No. 8,852,693 teaches a plasma based process of creating a coating with oleophobic and hydrophobic properties, where oleophobicity with a level of 5-6 is achieved in a time frame of the order of 2 minutes.) If the device contains unshielded semiconductor circuitry, such exposure to the plasma could damage the circuitry via capacitive coupling of the RF voltage used to generate the plasma and charged species reaching the surface of electronic components. In the semiconductor industry, where an ionized gas is necessary to clean, etch, or otherwise treat sensitive circuitry, a remote plasma source is used to generate ionized gas upstream. Electrons and ions in the plasma have a short life time and are eliminated through recombination and collision with the walls of the plasma chamber. Plasma-generated radicals that have no charge, on the other hand, have life-times longer than those of the electrons and ions in the plasma. Such radicals can be swept with neutral gas onto the substrate, where they react without adding charge that can affect and damage sensitive electronic circuitry of the substrate. Such remote plasma treatment protects and shields the electronic circuitry from the voltage used to generate the plasma and from the charging effects, and can be used to activate the substrate surface followed by the monomer deposition, thereby leading to the formation of a self assembled coating via covalent bonding with the substrate and subsequent polymerization. In contradistinction with method(s) of the related art, which require the presence of plasma in the immediate vicinity of the substrate in order to activate the functional monomer (which, in turn, leads to polymerization), the proposed method provides a unique and unanticipated arrangement for deposition of functional coatings on electronic circuitry.

In stark contradistinction with methodologies of the related art, the process of formation of a self-assembled polymer coating according to the idea of this invention can be used for coating substrates sensitive to direct exposure to plasma and/or exposure to plasma for an extended period of time. As shown in the examples below, the embodiments of the invention minimize the exposure of a substrate to an ionized gas created by a plasma (to times on the order of seconds and as low as a fraction of a second) thereby minimizing impact of plasma on the substrate properties.

EXAMPLE 1

Coating a Polypropylene Membrane

A roll of the polypropylene membrane (such as that shown in FIG. 2A) was placed to move at a speed of 150 ft/min in a vacuum chamber pumped to a pressure of $10^{-4}$ Torr. The chamber was then backfilled with a nitrogen gas to a pressure of 120 mTorr. Given that in this chamber there was no vacuum isolation between the plasma treatment zone and the monomer deposition zone, argon gas based plasma was used to activate the surface of the target membrane. The membrane was exposed to the ionized gas for a period of 0.2 seconds using 0.55 W per $cm^2$ of 40 KHz plasma. Inline with the plasma treatment, a quantity of approximately 5 nl/$cm^2$ of perfluorohexylethyl acrylate vapor was condensed onto the moving membrane several feet away from the plasma zone, which was enclosed in a shielded container so plasma could not escape into the rest of the chamber. The roll of membrane was removed from the vacuum chamber and the measured level of phobicity for oil was 6 and for water 90% of IPA (isopropyl alcohol). The coating had excellent adhesion to the membrane. The image of the coated membrane is shown in FIG. 2B.

EXAMPLE 2

Coating a Polypropylene Membrane

The process was performed under the conditions described in reference to Example 1, except that the same quantity of perfluorohexylethyl acrylate vapor was condensed onto the moving membrane at an ambient nitrogen pressure of 300 mTorr. The roll of membrane was removed from the vacuum chamber and the measured level of phobicity for oil was 8 and for water 100% of IPA. The measured degree of phobicity of backside of the membrane was 6 for oil and 80% IPA for water. The image of coated membrane is shown in FIG. 2C.

EXAMPLE 3

Coating of an Electronic Device

A printed circuit board with various surface-mounted active and passive components was pretreated and coated under the conditions described in reference to Example 2.

After the removal from the vacuum chamber, the board could not be wetted by dipping into water and measurement of phobic properties on various surface-mounted chips showed 6 for oil and 80% IPA for water.

The results obtained in the above-discussed examples show that at the lower ambient pressure of nitrogen a higher amount of monomer material evaporated during the polymerization process than that evaporated at the higher ambient pressure, resulting in a thinner and less dense polymer layer on the substrate. The higher pressure of nitrogen delayed the evaporation process, thereby allowing the monomer material more time to react with the surface and polymerize. It was determined that although the initial polymerization process takes place very rapidly, random termination processes slow down subsequent polymerization, and when excess monomer is condensed on the substrate surface, only the lower portion of such monomer layer is polymerized in a given time period, thus before a substrate is removed from the vacuum excess unpolymerized monomer is allowed to evaporate. Therefore, different monomer materials that have different molecular weight and vapor pressure require a different set of process conditions.

According to another implementation of the idea of the invention, a self-assembled polymer layer is formed on a substrate that has a polymer chemistry identical to that of the monomer used to produce it, and the chemical composition and stoichiometry that are unaffected by parameters of plasma (such as power, electrode geometry, gas pressure, and RF frequency, for example). In contradistinction with the embodiment of the invention, in coatings produced with assistance of plasma according to the related-art methodologies, the monomer molecules are randomly activated, ionized and cleaved by the plasma. Some low molecular weight fractions are further propagated to the vacuum pump, and the coatings are the result of random cross-linking, with unpredictable chemistry that is highly dependent on the plasma conditions.

Determining the composition of the plasma coatings requires the use of the surface analysis methods such as ESCA and XPS. In the case where an oleophobic coating is produced in the presence of a plasma of fluorine containing gases or monomers, U.S. Pat. Nos. 6,652,112 and 6,660,210, for example, utilized ESCA to identify the chemistry of the plasma and claimed random ratios of $CF_3:CF_2$ at least as high as 0.25 to 0.9. During the implementation of the idea of this invention, however, there is no plasma or other radiation present at the surface to randomly breakdown the precursor, and the coating produced as discussed in the above examples are not randomly cross-linked. Instead, and in contradistinction with the related art, the $CF_3:CF_2$ ratio in the polymer layer is not random but is exactly represented by the precursor molecule which in the Examples 1 and 2, for the perfluorohexylethyl acrylate, is 0.2.

Advantageously over the method(s) of related art, the embodiments of the present invention can utilize a broad range of organic monomers with various reactive moieties. As one skilled in the art will readily appreciate, the formation of a self-assembled polymer layer according to an embodiment of the invention involves the selection of appropriate organic monomers with certain level of reactivity determined by the presence of bonds that can open to initiate polymerization (such as acrylate, methacrylate, vinyl and allyl double bonds, for example), that can then be evaporated, condensed onto an activated substrate, allowed to polymerize, and re-evaporated from the substrate. The resulting properties of the so-coated with the polymer substrate may include oleophobic, hydrophobic, hydrophilic, antibacterial, release, color, metal chelating, electronic conductivity, and ionic conductivity properties, to name just a few. A large variety of compounds can be used either as single monomers or in a formulation of one or more components for coating a substrate according to the idea of the invention. Examples of these compounds include:

1. Acrylate and methacrylate compounds with various degrees of functionality, (for example, mono- and di-). The monomer molecules can be, for example, aliphatic, cycloaliphatic, aromatic, halogenated, metalated.

2. Alcohols such as allyl, methallyl, crotyl, 1-chloroallyl, 2-chloroallyl, cinnamyl, vinyl, methylvinyl, 1-phenallyl and butenyl alcohols; and esters of such alcohols with (i) saturated acids such as acetic, propionic, butyric, valeric, caproic and stearic, (ii) unsaturated acids such as acrylic, alpha-substituted acrylic (including alkylacrylic, e.g., methacrylic, ethylacrylic, propylacrylic, and the like, and arylacrylic such as phenylacrylic), crotonic, oleic, linoleic and linolenic; (iii) polybasic acids such as oxalic, malonic, succinic, glutaric, adipic, pimelic, suberic, azelaic and sebacic; (iv) unsaturated polybasic acids such as maleic, fumaric, citraconic, mesaconic, itaconic, methylenemalonic, acetylenedicarboxylic and aconitic; and (v) aromatic acids, e.g., benzoic, phenylacetic, phthalic, terephthalic and benzoylphthalic acids.

3. Acids and esters with lower saturated alcohols, such as methyl, ethyl, propyl, isopropyl, butyl, isobutyl, sec-butyl, tert-butyl, 2-ethylhexyl and cyclohexyl alcohols, and with saturated lower polyhydric alcohols such as ethylene glycol, propylene glycol, tetramethylene glycol, neopentyl glycol and trimethylolpropane.

4. Lower polyhydric alcohols, e.g., butenediol, and esters thereof with saturated and unsaturated aliphatic and aromatic, monobasic and polybasic acids, examples of which appear above.

5. Esters of the above-described unsaturated acids, especially acrylic and methacrylic acids, with higher molecular weight monohydroxy and polyhydroxy materials such as decyl alcohol, isodecyl alcohol, oleyl alcohol, stearyl alcohol, epoxy resins and polybutadiene-derived polyols.

6. Vinyl cyclic compounds including styrene, o-, m-, p-chlorostyrenes, bromostyrenes, fluorostyrenes, methylstyrenes, ethylstyrenes and cyanostyrenes; di-, tri-, and tetra-chlorostyrenes, bromostyrenes, fluorostyrenes, methylstyrenes, ethylstyrenes, cyanostyrenes; vinylnapthalene, vinylcyclohexane, divinylbenzene, trivinylbenzene, allylbenzene, and heterocycles such as vinylfuran, vinylpridine, vinylbenzofuran, N-vinylcarbazole, N-vinylpyrrolidone and N-vinyloxazolidone.

7. Ethers such as methyl vinyl ether, ethyl vinyl ether, cyclohexyl vinyl ether, octyl vinyl ether, diallyl ether, ethyl methallyl ether and allyl ethyl ether.

8. Ketones, e.g., methyl vinyl ketone and ethyl vinyl ketone.

9. Amides, such as acrylamide, methacrylamide, N-methylacrylamide, N-phenylacrylamide, N-allylacrylamide, N-methylolacrylamide, N-allylcaprolatam, diacetone acrylamide, hydroxymetholated diacetone acrylamide and 2-acrylamido-2-methylpropanesulfonic acid.

10. Aliphatic hydrocarbons; for instance, ethylene, propylene, butenes, butadiene, isoprene, 2-chlorobutadiene and alpha-olefins in general.

11. Alkyl halides, e.g., vinyl fluoride, vinyl chloride, vinyl bromide, vinylidene chloride, vinylidene bromide, allyl chloride and allyl bromide.

12. Acid anhydrides, e.g., maleic, citraconic, itaconic, cis-4-cyclohexene-1,2-dicarboxylic and bicyclo(2.2.1)-5-heptene-2,3-dicarboxylic anhydrides.

13. Acid halides such as cinnamyl acrylyl, methacrylyl, crotonyl, oleyl and fumaryl chlorides or bromides.

14. Nitriles, e.g., acrylonitrile, methacrylonitrile and other substituted acrylonitriles.

15. Monomers with conjugated double bonds.

16. Thiol monomers.

17. Monomers with allylic double bonds.

18. Monomers with epoxide groups.

Although the examples of the implementation of the invention were described to include processing at certain partial vacuum pressures, a skilled in the art person would recognized that similar process(es) can be effectuated at different levels of intra-chamber pressure, including atmospheric pressure. The properties of the self-assembled polymer layer formed in the absence of plasma according to an embodiment of the invention can be optionally further changed by, for example, subsequently treating the formed layer with radiation (including heat, plasma, electron beam and UV light). In a related embodiment, a formation of an activated layer on the target surface preceding the step of condensation of a monomer can be facilitated with the use of plasma that contains a mixture of inert gases and/or reactive vapors such as, for example, silanes, siloxanes, acetylene, oxygen and gases and vapors that contain active species, such as S, Si, Cl, F and Br.

Figure 3:
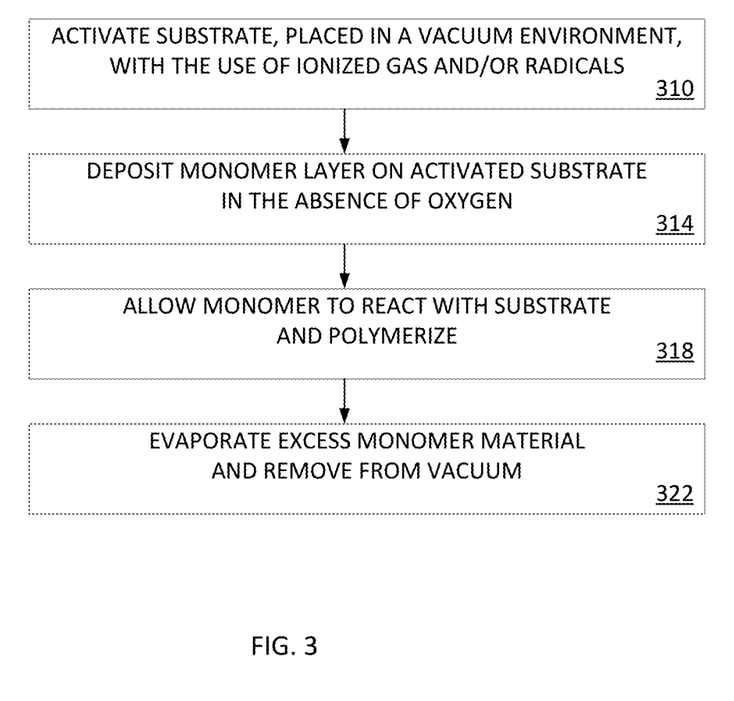
FIG. 3 is a flow-chart illustrating one implementation of a method of the invention.

FIG. 3 presents a non-limiting example of a process implemented in the present invention, which includes the steps of activation of a substrate in a vacuum with the use of ionized gas/radicals, at 310, followed by a deposition of a layer of monomer material on the activated substrate in the absence of oxygen, at 314, as discussed above, and reaction of the monomer material with the substrate and polymerization of the monomer material, at 318. Additionally, the process may include a step 322 of evaporation of excess monomer material.

References throughout this specification to "one embodiment," "an embodiment," "a related embodiment," or similar language mean that a particular feature, structure, or characteristic described in connection with the referred to "embodiment" is included in at least one embodiment of the present invention. Thus, appearances of the phrases "in one embodiment," "in an embodiment," and similar language throughout this specification may, but do not necessarily, all refer to the same embodiment. It is to be understood that no portion of disclosure, taken on its own and in possible connection with a figure, is intended to provide a complete description of all features of the invention.

Within this specification, embodiments have been described in a way that enables a clear and concise specification to bet written, but it is intended and will be appreciated that embodiments may be variously combined or separated without parting from the scope of the invention. In particular, it will be appreciated that all features described herein at applicable to all aspects of the invention.

In addition, when the present disclosure describes features of the invention with reference to corresponding drawings (in which like numbers represent the same or similar elements, wherever possible), the depicted structural elements are generally not to scale, and certain components are enlarged relative to the other components for purposes of emphasis and understanding. It is to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, at least for purposes of simplifying the given drawing and discussion, and directing the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this particular detail in the drawing may be implied unless the context of the description requires otherwise. In other instances, well known structures, details, materials, or operations may be not shown in a given drawing or described in detail to avoid obscuring aspects of an embodiment of the invention that are being discussed. Furthermore, the described single features, structures, or characteristics of the invention may be combined in any suitable manner in one or more further embodiments.

Moreover, if the schematic flow chart diagram is included the depicted order and labeled steps of the logical flow are indicative of one embodiment of the presented method. Other steps and methods may be conceived that are equivalent in function, logic, or effect to one or more steps, or portions thereof, of the illustrated method. Without loss of generality, the order in which processing steps or particular methods occur may or may not strictly adhere to the order of the corresponding steps shown.

The invention as recited in claims appended to this disclosure is intended to be assessed in light of the disclosure as a whole, including features disclosed in prior art to which reference is made.

What is claimed is:

1. A method for coating a substrate in a partial vacuum, the method comprising:
   a. activating a surface of the substrate in the partial vacuum to form an activated layer of said substrate;
   b. depositing a functional monomer material that contains at least one double bond on said activated layer in the absence of oxygen gas;
   c. maintaining contact between said monomer material and said activated layer for a time period sufficient to form a self-assembled functional polymer layer on said surface in absence of curing said monomer material with a radiation source;
   d. evaporating un-polymerized monomer material.

2. The method according to claim 1, wherein said activating includes activating a porous surface of the substrate.

3. The method according to claim 1, wherein the depositing includes condensing a fluorine-containing monomer material on the activated layer.

4. The method according to claim 1, wherein the depositing includes depositing a fluorine-containing monomer material having a first $CF_3:CF_2$ ratio, and further including
   forming the functional polymer layer that has a second $CF_3:CF_2$ ratio, the first and second $CF_3:CF_2$ ratios being equal.

5. The method according to claim 4, wherein at least one of said depositing, forming, and maintaining is effectuated under processing conditions that ensure that the first and second $CF_3:CF_2$ ratios are equal to 0.2.

6. The method according to claim 1, wherein said activating is produced by at least one of plasma and remote plasma.

7. The method according to claim 1, wherein said maintaining includes forming said functional polymer layer having oleophobic and hydrophobic properties.

8. The method according to claim 1, wherein said functional polymer layer has at least one of hydrophilic properties and oleophilic properties.

* * * * *